United States Patent [19]
Paoli

[11] Patent Number: 5,742,631
[45] Date of Patent: Apr. 21, 1998

[54] INDEPENDENTLY-ADDRESSABLE MONOLITHIC LASER ARRAYS

[75] Inventor: Thomas L. Paoli, Los Altos, Calif.

[73] Assignee: Xerox Corporation, Stamford, Conn.

[21] Appl. No.: 688,179

[22] Filed: Jul. 26, 1996

[51] Int. Cl.$^6$ ............................................... H01S 3/19
[52] U.S. Cl. ............................... 372/50; 372/45; 372/46; 372/48
[58] Field of Search ...................... 372/50, 45, 46, 372/27, 48

[56] References Cited

U.S. PATENT DOCUMENTS

| | | | |
|---|---|---|---|
| 5,038,185 | 8/1991 | Thornton | 357/17 |
| 5,157,680 | 10/1992 | Goto | 372/50 |
| 5,208,821 | 5/1993 | Berger et al. | 372/48 |
| 5,243,359 | 9/1993 | Fisli | 346/1.1 |
| 5,322,970 | 6/1994 | Behe et al. | 118/651 |
| 5,376,583 | 12/1994 | Northrup et al. | 437/133 |
| 5,386,139 | 1/1995 | Idei et al. | 372/48 |
| 5,386,428 | 1/1995 | Thornton et al. | 372/50 |
| 5,412,678 | 5/1995 | Treat et al. | 372/45 |
| 5,438,584 | 8/1995 | Paoli et al. | 372/45 |
| 5,465,263 | 11/1995 | Bour et al. | 372/23 |
| 5,497,391 | 3/1996 | Paoli | 372/50 |
| 5,513,200 | 4/1996 | Paoli | 372/50 |
| 5,663,975 | 9/1997 | Yoshida et al. | 372/46 |

OTHER PUBLICATIONS

R.D. Dupuis, "AlGaAs–GaAs Lasers Grown by Metalorganic Chemical Vapor Deposition — A Review", Journal of Crystal Growth 55 (1981), North–Holland Publishing Company, pp. 213–222 (no month).

R.D. Dupuis, P.D. Dapkus, "Single–longitudinal–mode cw room–temperature Ga1–xAlxAs–GaAs channel–guide lasers grown by metalorganic chemical vapor deposition", Appl. Phys. Lett.33(8), 15 Oct. 1978, pp. 724–726.

Y. Mori, O, Matsuda, K. Morizane and N. Watanabe, "V–DH Laser: A Laser with a V–Shaped Active Region Grown by Metalorganic C.V.D.", Electronics Letters 25th Sep. 1980, vol. 16, No. 20, pp. 785–787.

*Primary Examiner*—James W. Davie

[57] ABSTRACT

This invention relates to a laser array which can produce monolithic, closely-spaced, independently-addressable lasing elements. More specifically, this invention simplifies the formation of solid state laser arrays through the use of as-grown buried lateral waveguiding structures.

23 Claims, 6 Drawing Sheets

INDEPENDENTLY-ADDRESSABLE MONOLITHIC LASER ARRAYS

FIELD OF INVENTION

The present invention relates generally to solid state lasers. More specifically, the invention relates to monolithic, closely-spaced, independently-addressable, solid state laser arrays.

BACKGROUND OF INVENTION

Closely-spaced, independently-addressable, solid state laser arrays are important devices in current high-speed xerographic printing technology. Generally, in xerographic printing, a photoreceptor is used to form an electrostatic image, which is also known as a latent image, before producing a permanent image on a recording medium such as paper. To form a latent image, the entire surface of the photoreceptor is first electrostatically charged. Then, a laser beam strikes a rotating, multi-faceted, polygon mirror which deflects the laser light onto selected areas of the photoreceptor. Rotating polygon mirrors and their related optics are generically referred to as ROS's (Raster Output Scanners). The areas exposed to the laser beam are discharged, resulting in a pattern of charged and discharged areas on the photoreceptor. This pattern, which is the latent image, corresponds to a source pattern or source image to be reproduced or printed. The pattern is then developed by bringing the photoreceptor in contact with toner. The toner adheres to the charged areas of the photoreceptor and is then transferred to a recording medium. A typical xerographic printing process is described in U.S. Pat. No. 5,322,970, entitled "Ceramic Donor Roll For Scavengeless Development In A Xerographic Apparatus" by T. Behe et al.

The speed of such a xerographic printer is generally limited by the rate at which the laser beam can be swept across the photoreceptor to form a latent image. The sweep rate of the laser beam, in turn, depends upon the rotational speed of the polygon mirror. The faster the mirror can deflect light across a photoreceptor, the faster a latent image is formed. This sweep rate is a particularly serious limitation in high-speed, full-color printing because a full-color print requires a separate latent image for each color printed, hereinafter called a system color. For instance, a full color printer forms an image by superimposing a latent image in black with a latent image in each of the three primary colors (cyan, magenta, and yellow). This process significantly limits the throughput of a printer.

One solution to increase the efficiency of this process employs a separate rotating polygon mirror for printing each system color. Although such a system generally has a higher print speed, they are expensive because of the additional costs of the separate mirror and optical components required for each ROS. Worse yet, such a system often suffers image quality problems because of the difficulties in producing nearly identical mirrors and optical systems for all of the four ROS's. The quality issues associated with imperfections in superimposing the color images of a single source are generally referred to as registration problems. The difference in the optics in each of the system colors results in a slightly different image for each color, creating noticeable imperfections in the superimposed final image.

Another approach to improve print speed is to increase the rotational speed of the multi-faceted polygon mirror. While this method can increase the sweep or raster rate of the laser source, it requires an expensive drive motor and bearings so that the mirror can rotate faster.

A more recent approach, which utilizes multiple laser beams, is described in U.S. Pat. No. 5,243,359 entitled "Raster Output Scanner For A Multistation Xerographic Printing System" by T. Fisli. Under this approach, four laser beams, one for each system color, simultaneously strike a single raster output polygon mirror and a single set of scan optics. The beams are then separated by optical filters, and each beam is directed to a photoreceptor for printing a system color.

However, to ensure that the image produced by each photoreceptor is in registration, the laser beams should ideally originate from a common spatial location so that they share a common optical axis with respect to the rotating polygon mirror. In practice, the laser beams should be as close to each other as possible. Furthermore, the lasers in the array must have adequate separation in their wavelengths so that the optical filters can effectively isolate each beam at a reasonable cost.

For individual lasers in an array to be independently separable, the difference in wavelength between any two lasers generally has to be at least 50 nanometers (nm). As discussed previously, since there are four colors for full-color printing, four laser beams with wavelengths that span at least 150 nm are required to implement this approach. To make such a four-laser array, the use of two semiconductor material systems is generally required. For instance, the $Al_xGa_{1-x}As$ material system can produce only lasers with wavelengths from approximately 750 nm to 850 nm whereas the AlGaInP material system can produce lasers from approximately 630 to 700 nm. Since neither system can provide lasers with a wavelength separation of at least 150 nm, it is necessary to fabricate the laser array using both material systems on a single substrate.

One technique to form lasers using two material systems on a single substrate involves the growth of a first set of active and cladding layers using one material system, which then is followed by removal of the active and cladding layers in parts of the substrate by an etching process. Then, the active and cladding layers that remain are masked, and a second set of active and cladding layers using another material system is epitaxially deposited adjacent to the remaining active and cladding layers. This technique allows for the formation of an independently-addressable laser array using two material systems. An example of this technique is described in U.S. Pat. No. 5,465,263, entitled "Monolithic Multiple Wavelength Dual Polarization Laser Diode Arrays" by Bour et al.

A disadvantage of this method is the difficulty in achieving closely-spaced laser arrays using this approach. It is difficult to place two laser beams close to each other because after the first active and cladding layers are removed from parts of the substrate by an etching process, a second set of active and cladding layers are then epitaxially deposited on the etched areas, adjacent to where the first active and cladding layers remain. The vertical interface between the two active areas typically may contain crystal damage or contamination caused by the etching process. As a result, it is desirable to form lasers away from the interface. Furthermore, this technique requires more complicated manufacturing process involving etching and regrowth. After the first epitaxial growth is used to form the first active layer, the sample has to be removed from the reaction chamber for etching. Afterwards, the sample undergoes another deposition process for a second set of active and cladding layers, during which the first active layer has to undergo a long high-temperature cycle. Such a high temperature cycle may cause deterioration or instability in the active layer.

A common solution to fabricate closely-spaced, separable, independently-addressable, monolithic laser arrays, which output multiple wavelengths or orthogonally polarized beams, utilizes a so-called "stacked active regions" approach. Such an approach can not only produce laser arrays required for high-speed full-color printing, but also laser beams which are axially aligned with each other. In other words, laser beams of an array fabricated by this approach share a common optical axis, making it particularly useful in high-speed, multi-beam, raster output scanning (ROS), color printing. Several stacked active region structures are described in U.S. Pat. No. 5,157,680, entitled "Integrated Semiconductor Laser," by Goto and U.S. Pat. No. 5,386,428, entitled "Stacked Active Region Laser Array For Multicolor Emissions," by Thornton et al.

Generally, a stacked active region monolithic array includes multiple sets of active layers, which are sandwiched in the same waveguide. For instance, a 2-laser array is typically formed by first depositing a lower cladding layer on a semiconductor substrate, after which two active layers are sequentially deposited on the cladding layer. Each active layer is optimized to output a laser beam of a desired wavelength. Under this stacked layer approach, the second active layer is grown above the first active layer during the same epitaxial process. No removal of any part of the first active layer is required, and hence no vertical interface between the two active layers exists. This allows two laser beams to be formed in close proximity to each other in the horizontal direction. Furthermore, neither active layer has to endure an additional high temperature cycle during which the substrate is heated up. After both active layers have been formed, the active region closest to the surface will be removed by an etching process, allowing the lower active region to lase at a particular wavelength. To accomplish the removal of the top active layer, an etch stop layer is generally inserted between the two active layers to minimize unintentional removal of any portion of the lower active layer. After the etching process is completed, a final cladding layer and capping layer are grown over the entire sample.

Although such a stacked growth approach provides closely-spaced laser beams in the horizontal direction, it continues to suffer key disadvantages. The top active layer needs to be removed in order to access the lower active layer, and both active layers are constrained to emit into the same optical waveguide. In other words, the cladding layers can be optimized for only one of the active layers. Furthermore, the selective removal of the top active region depends upon a well-controlled etching step. Since the active region is only 10 to 20 nm in thickness, any over-etching may remove all or part of the lower active region. After the etching has been performed, layers immediately above the lower active region are exposed. The exposed area is susceptible to undesirable contamination or oxide formation, which is a particularly serious problem in the more reactive $Al_xGa_{1-x}As$ material system.

Hence, substantial effort has been expended to develop a technique which allows for the formation of an independently-addressable laser array with closely-spaced and separable laser beams.

BRIEF SUMMARY OF INVENTION

The present invention maintains key advantages of a stacked-growth technique, but at the same time eliminates the need for removing either the top or bottom active region. In other words, this invention does not depend upon an etching process to remove layers as thin as 10 to 20 nm.

An advantage of the present invention is that the vertical separations between lasers can be accurately and reproducibly controlled by epitaxial growths. At the same time, since no etching of the active region is involved, the chances of contamination or oxidation of the sample are minimal.

Another advantage of the present invention is that each active layer emits into a separate optical waveguide formed by a different set of cladding layers. Thus, the cladding layers can be separately optimized for each active layer, current injection or both.

Yet another advantage of the present invention is that the first active region is grown on a patterned substrate, which automatically forms an as-grown lateral waveguide for the lower laser structure. No additional processing is required to form the lower lateral waveguide. In contrast, in a traditional stacked-growth approach, an impurity induced layer disordering ("IILD") process or an etching is required to form the lateral waveguides from the surface of the semiconductor sample. Generally, a waveguide can be formed in buried layers only by etching off or diffusing through the upper layers. If an IILD process is used, it is well-known that such a process is not well controlled in structures involving phosphides and arsenides. Thus, if an IILD process is used, a conventional stacked growth technique greatly limits the material systems that can be used, and thus the wavelength separation of lasers that can be achieved. If an etching process is used, the process is difficult to control and leads to lateral waveguides which are not optimized for at least one of the wavelengths produced by the active layers. In addition, the resulting structure is highly non-planar, which requires substantial epitaxial regrowth to planarize the final structure.

A further advantage of this invention is that the top surface of the monolithic chip remains substantially planar. In one embodiment, only a single regrowth is required to form the lateral waveguides of the top laser structure. No etching is required to form the lateral waveguides of the lower laser structure. In another embodiment which uses IILD to form the lateral waveguides of the top laser structure, all the layers for forming the laser array are grown during a single epitaxial process and therefore requires no regrowth.

The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
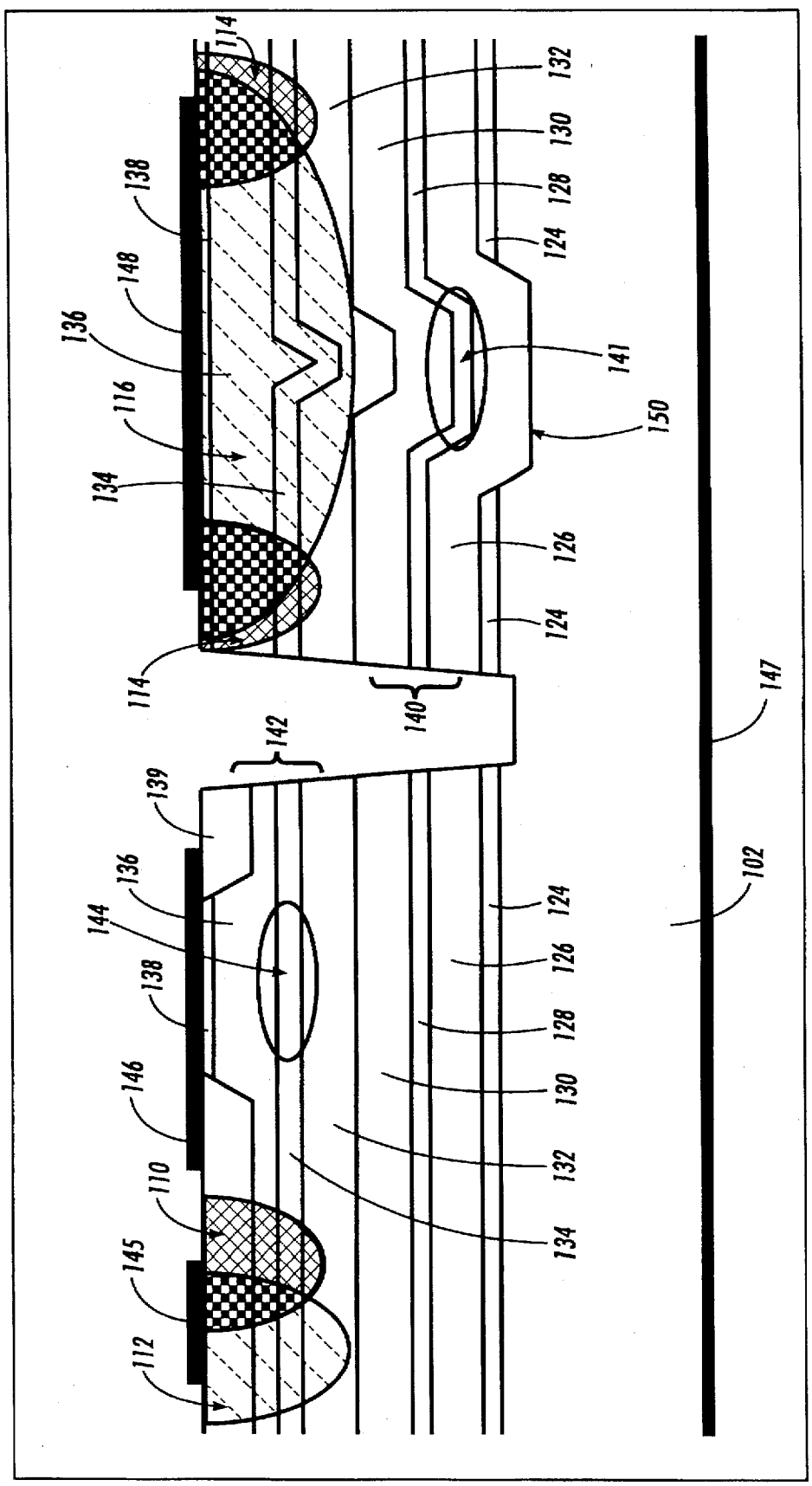
FIG. 1 illustrates a cross-sectional view of a dual laser array with as-grown waveguiding regions for one of its lasing elements formed on an n-type GaAs substrate which has a channel structure.

FIG. 1 illustrates the preferred embodiment of the present invention. It illustrates a monolithic laser array with two closely-spaced, separable, independently-addressable lasers formed on an n-type GaAs substrate 102. The first laser structure 140 is formed above a channel 150 in the n-type substrate 102 whereas the second laser structure 142 is above the first laser structure 140 in an area outside the channel in the substrate. In this case, the upper laser structure 142 has a GaAs or $Al_yGa_{1-y}As$ active layer, 134, that produces a laser with a longer wavelength ($\lambda_1$) of nominally 780 nm. The lower laser structure 140 has a GaInP active layer, 128, that produces a laser with a shorter wavelength ($\lambda_2$) of nominally 680 nm. The wavelength separation achieved by using two material systems enables this embodiment to be easily extended to form a four-laser array for xerographic printing. Generally, the active region closest to the surface has a lower bandgap, and the bandgap increases for each active region that is further away from the surface. This sequence of active regions is generally preferred because it is easier to dope through the low-bandgap materials in order to provide injection to the lower lasing element.

Figure 2:
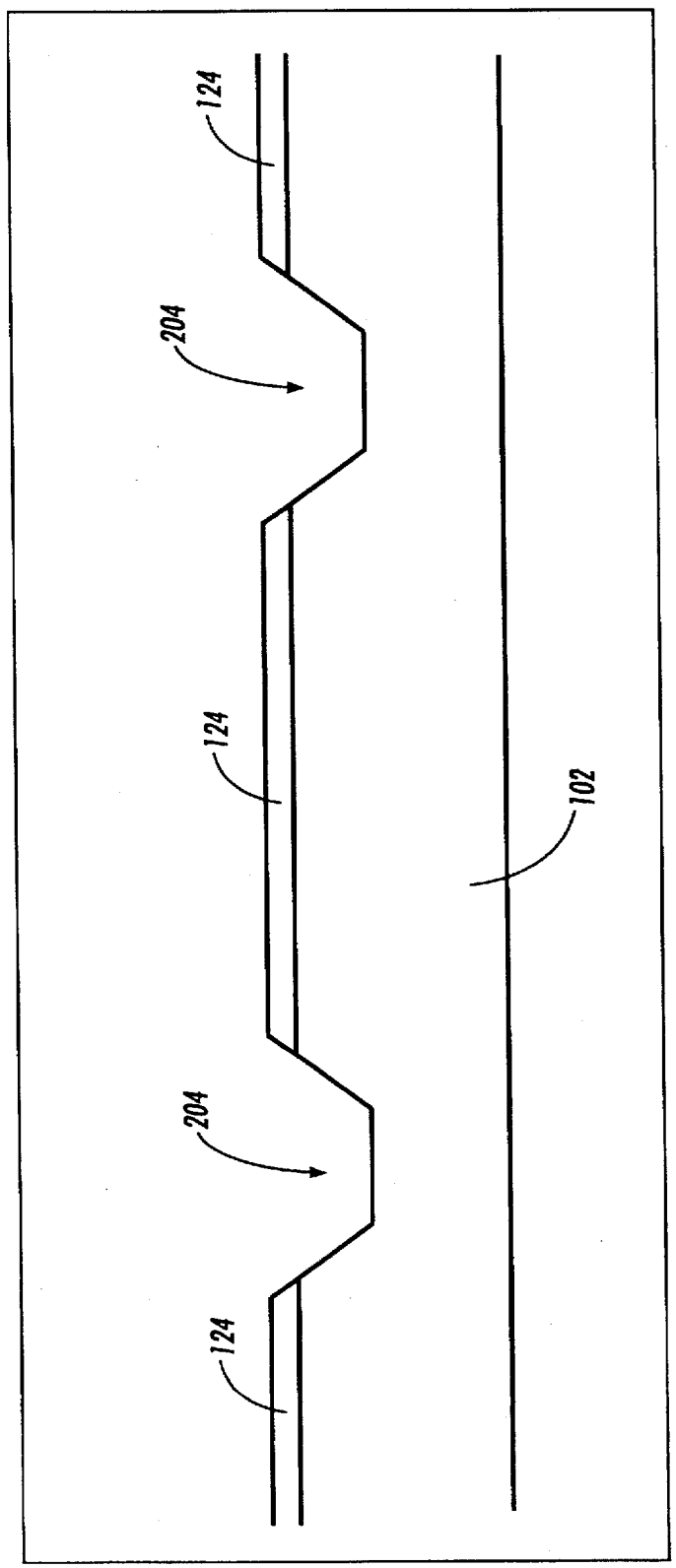
FIG. 2 illustrates a cross-sectional view of an n-type GaAs substrate, after a p-type GaAs layer has been deposited and an etching step has been performed to create channel structures.

FIG. 2 illustrates the pre-processing required prior to the epitaxial deposition of semiconductor layers forming the two laser structures, 140 and 142, shown in FIG. 1. As shown in FIG. 2, a thin layer of approximately 0.5 µm to 1.0 µm of p-type GaAs 124 is first deposited on the n-type GaAs substrate 102. Then, channels or grooves 204 are formed in the substrate by etching through windows in a mask. Reactive ion etching, ion milling, or other means known to those of ordinary skill in the art may also be used to form the channels. The p-type GaAs layer 124 provides current confinement to the laser structures that will be formed above the channels 204. For instance, when laser structures above the channels 204 are in operation, the p-type GaAs layer 124 and the n-type layer AlInP 126 will form a reverse biased junction, confining the current to flow only through the channels, 204, where the p-type GaAs layer 124 has been previously removed. The channels 204 shown in FIG. 2 are typically 2 µm to 10 µm in their widths and depths. The spacing between two lasing elements is approximately 10 µm. The spacing between the two channels 204 is approximately 500 µm, which also defines the chip-to-chip separation of the multi-laser arrays. These dimensions may vary depending upon factors such as the technique for forming the channels and the number of lasing elements in each array.

Figure 3:
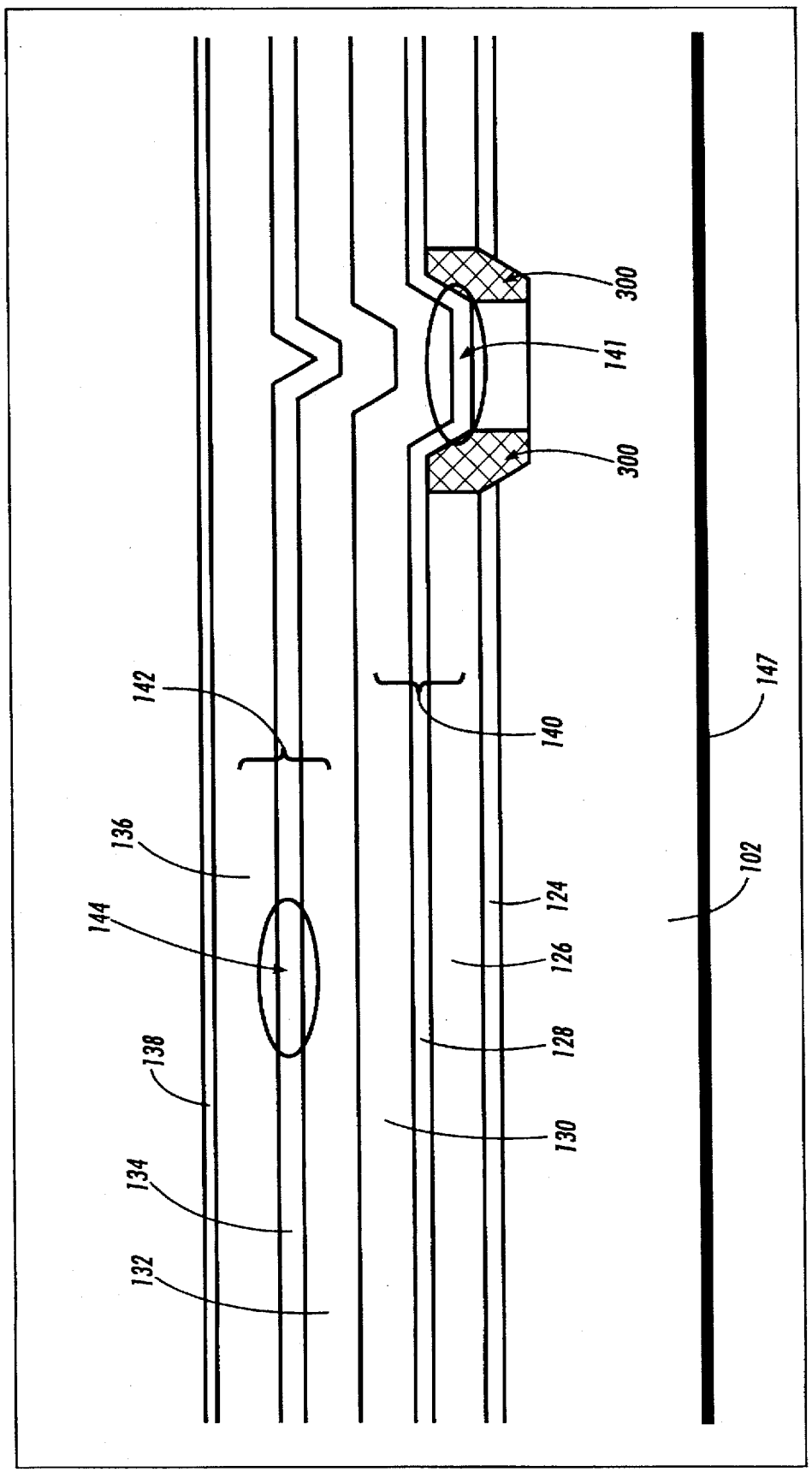
FIG. 3 illustrates an intermediate structure in the fabrication of the laser array illustrated in FIG. 1, prior to the formation of the waveguiding structures for the lasing element closest to the surface of the semiconductor sample.

After the channels have been formed in the substrate, an epitaxial deposition process known as metal-organic chemical vapor deposition (MOCVD) is used to form the semiconductor layers of a laser structure. The laser structure may also be fabricated on a wafer substrate by liquid phase epitaxy (LPE), molecular beam epitaxy (MBE), or other known crystal growth processes. As shown in FIG. 3, a cladding layer of n-type $Al_xIn_{1-x}P$ (126) with a thickness of about 1 µm or less is first epitaxially deposited on the starting material. The mole fraction of aluminum in the $Al_xIn_{1-x}P$ layer 126 is approximately 0.5, which produces an AlInP layer 126 which is lattice-matched to the underlying GaAs substrate 102. Above the AlInP layer 126, an undoped $Ga_xIn_{1-x}P$ layer 128 is deposited to form the active layer of the lower laser structure 140. The mole fraction of indium in the active layer is approximately 62%, which provides a laser of wavelength approximately 670 nm for a layer thickness of 15 nm. The mole fraction of indium can vary depending upon the desired output wavelength. The active region can include a single quantum well structure, a multiple quantum well structure, or a thicker non-quantum well layer. The typical thickness of a quantum well is 5 to 20 nm. Also, the active $Ga_xIn_{1-x}P$ layer 128 can be lattice-matched or lattice-mismatched to the underlying GaAs substrate 102.

If the active layer such as the $Ga_xIn_{1-x}P$ layer 128 shown in FIG. 3, is mismatched to the lattice structure of the underlying GaAs substrate 102, it is well-known that a tensile strain can be created in the active layer so that the laser will be switchable between its transverse electric (TE) and transverse magnetic (TM) mode of operation. A solid state laser which is switchable between TE and TM polarization modes of operation is described in U.S. Pat. No. 5,438,584 entitled "Dual Polarization Laser Diode With Quarternary Material System" by Paoli et al. The present invention is equally applicable to laser arrays which use the two orthogonally-polarized modes to form independently-addressable lasing elements. The lasing elements at each wavelength will emit radiation in different polarization modes, which can easily be separated by a polarizing beam splitter. Alternatively, active layer 128 can be compressively strained so that it will oscillate in its transverse electric (TE) polarized mode while active layer 134 can be tensilely strained so that it will oscillate in its transverse magnetic (TM) polarized mode. Thus, the lasing elements will emit radiation in different polarization modes at the same or different wavelengths.

FIG. 3 shows that a p-type $Al_xIn_{1-x}P$ cladding layer, 130, of about 0.8 to 1.0 µm is above the lower active layer 128. A typical mole fraction of aluminum in the material is 0.5. These grown layers tend to conform to the topology of the underlying GaAs substrate 102, forming the lower lasing element 141 above the channel. The lateral waveguide of the lower lasing element 141 is formed during the epitaxial deposition process. The cross-hatched areas 300 of the $Al_xIn_{1-x}P$ layer 126 shown in FIG. 3 confine the optical field of the lower lasing element 141 in the lateral direction. The cross-hatched areas 300 above the sidewalls of the channel provide the difference in effective refractive index necessary for lateral waveguiding of the lower lasing element. The present invention can equally be applied to laser arrays which emits light in a direction vertical to the surface of the substrate. Further, as discussed previously, the n-p junction formed between the p-type GaAs layer 124 and the n-type AlInP cladding layer 126 confines the current to the channel structure.

Figure 4:
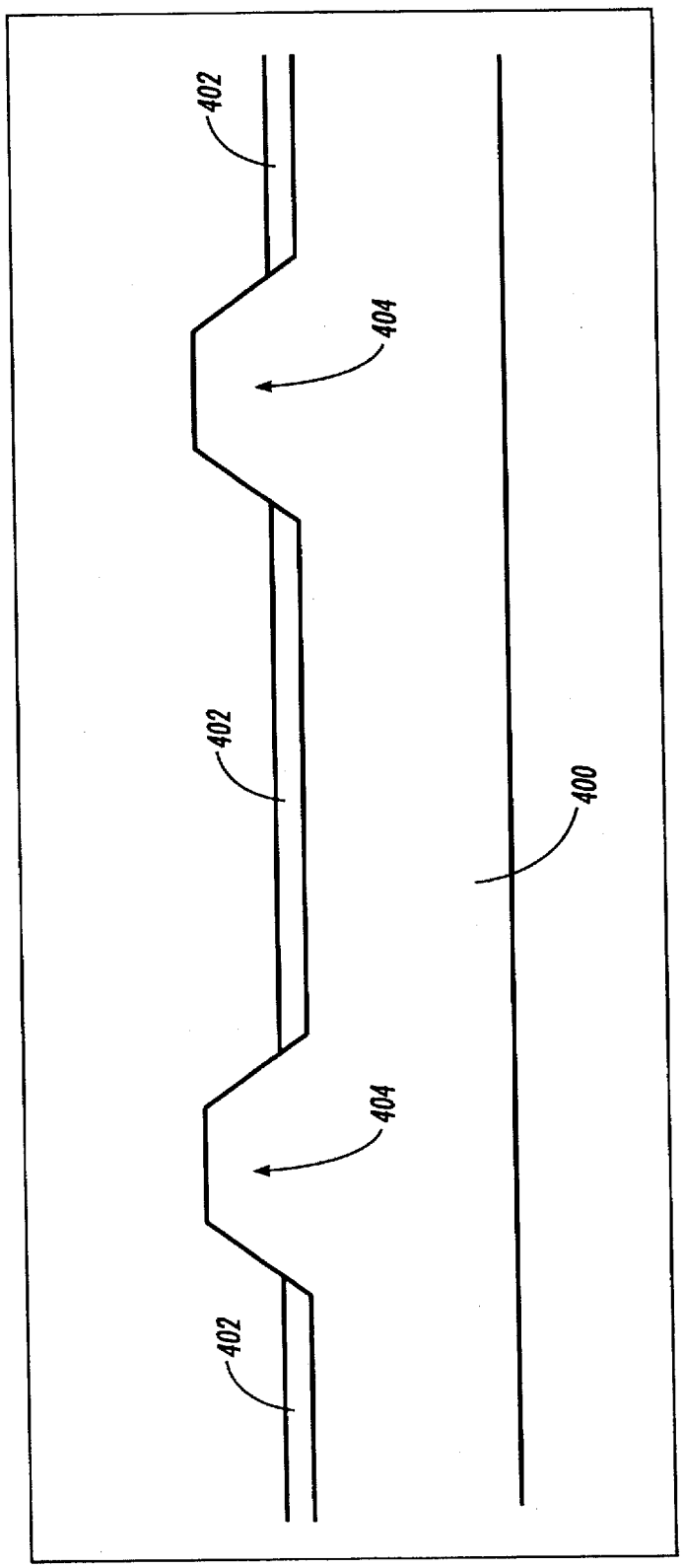
FIG. 4 shows a cross-sectional view of an alternative substrate structure which includes a mesa that can be used to form a dual laser array with as-grown lateral waveguiding regions in accordance with the invention.

This embodiment utilizes a channel to form the lateral waveguide for the lower lasing element. However, nothing in this invention prevents using the topology of any other raised or depressed structure such as a mesa to achieve lateral waveguiding. Generally, the depth of the raised or depressed structure should be at least on the order of magnitude of the total thickness of the epitaxial layers. For instance, as shown in FIG. 4, lateral waveguiding can be achieved using n-type mesa structures 404 on an n-type GaAs substrate 400. Under this approach, current confinement is also achieved by a blocking layer of p-type GaAs 402 of approximately 0.5 to 1.0 µm.

In the present embodiment, the set of layers for the upper laser structure 142 shown in FIG. 3 can be formed without removing the sample from the epitaxial deposition chamber.

This set of layers uses the $Al_xGa_{1-x}As/GaAs$ material system, thereby creating lasers with wavelengths ranging from nominally 750 to 850 nm. Under the present invention, other material systems such as AlGaAs/AlGaAsP or AlGaAs/InGaAsP can also be used to form the upper laser structure 142. If the same material is used, the wavelength at which the top lasing element 142 emits radiation can be controlled by altering the composition of the active layer. As discussed previously, the polarization direction of the laser at each wavelength can be controlled by switching operation between TE and TM modes. The disadvantage of using the same material system to fabricate the entire laser array is that the lasers formed have smaller wavelength separation.

As shown in FIG. 3, to form the upper laser structure 142, 0.8 to 1.0 μm of p-type $Al_xGa_{1-x}As$ 132, is deposited on top of the p-type $Al_xIn_{1-x}P$ layer 130. The mole fraction of aluminum in the $Al_xGa_{1-x}As$ layer is approximately 0.8. Above the p-type $Al_xGa_{1-x}As$ layer 132 is an undoped or lightly doped GaAs or $Al_yGa_{1-y}As$ active layer 134. If $Al_yGa_{1-y}As$ is used, the aluminum mole fraction should generally be lower than the aluminum mole fraction in the cladding layers. The active layer 134 may be a single quantum well, a multiple quantum well, or a layer with thickness greater than that of a quantum well. The thickness of a quantum well is again about 5 to 20 nm. Then, above the active layer, approximately 1.0 μm of n-type $Al_xGa_{1-x}As$ layer 136 and 100 nm of an n-type GaAs cap layer 138 are deposited.

In this embodiment, the semiconductor layers which are made of the phosphide materials are first grown before the layers which are made of the arsenide materials are deposited. This invention is also applicable to an embodiment in which the arsenide materials are deposited before the phosphide materials. A p-type GaAs substrate can also be used in this invention. In such an event, the doping of each layer will simply be reversed from n-type to p-type or vice versa.

This invention does not prevent the use of the same material system to be used to form a dual laser array. In fact the same material system can be used to form both sets of laser structures. Under such an approach, instead of using two lasers each with a different wavelength, active layer 128 can be compressively strained so that it will oscillate in its transverse electric (TE) mode and active layer 134 can be tensilely strained so that it will oscillate in its transverse magnetic (TM) mode. Thus, the lasing elements will emit radiation in orthogonally polarized modes at the same or different wavelengths. Since the two modes can be easily separated by a polarizing beam splitter configuration, there is no need to use two separate material systems.

Figure 5:
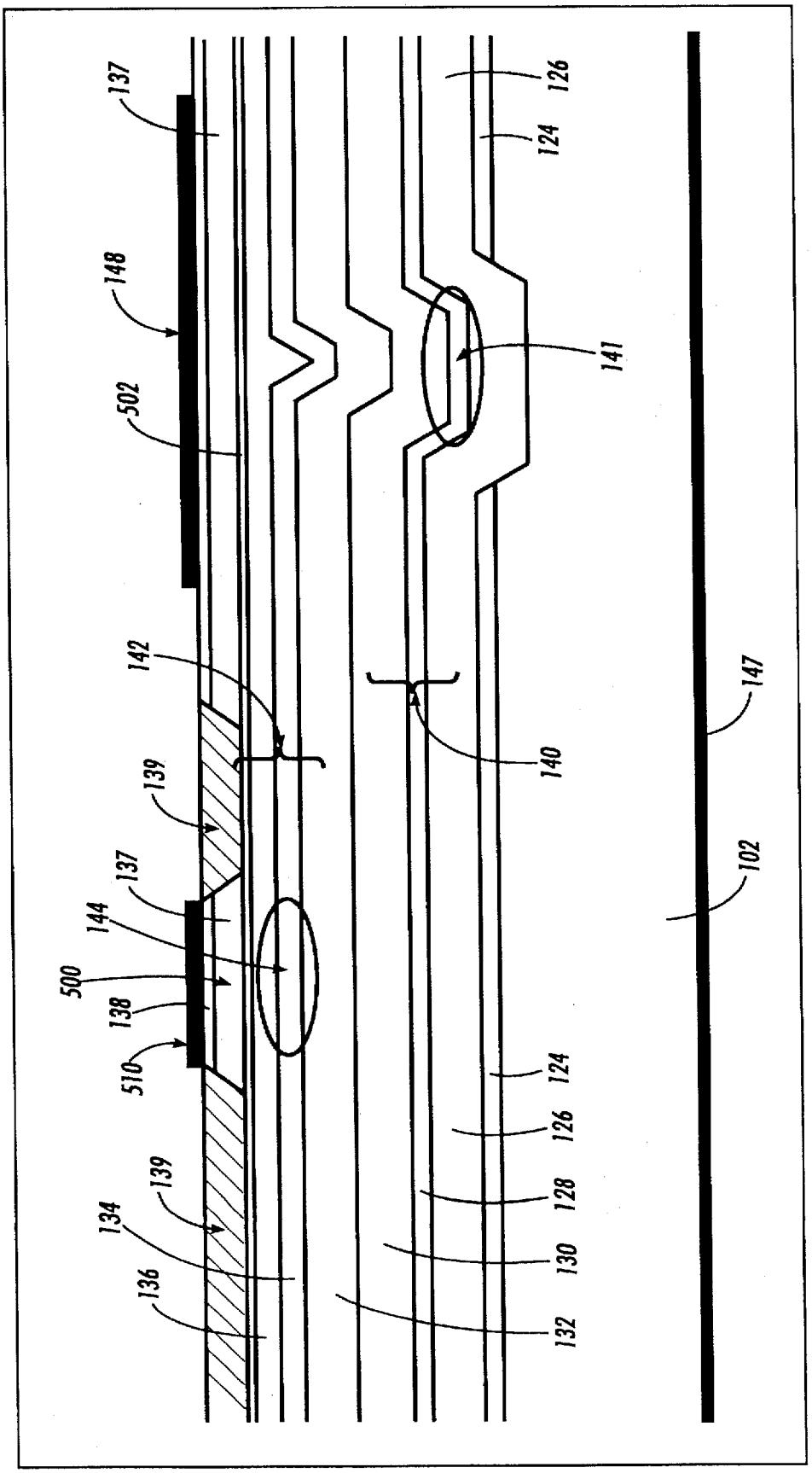
FIG. 5 shows a dual laser array in which the lateral waveguiding structure for the lasing element closest to the surface is formed by a mesa structure.

One approach to forming the lateral waveguides for the upper lasing element 144 is to use a ridge or mesa structure, 500, as shown in FIG. 5. Under this approach, after approximately 0.4 μm of the n-type $Al_xGa_{1-x}As$ layer 136 has been deposited, an etch stop layer 502 such as 5 nm of $Ga_{0.5}In_{0.5}P$ or $Al_zGa_{1-z}As$ is grown. If an $Al_zGa_{1-z}As$ layer is used as an etch stop layer, the mole fraction of aluminum is typically less than 10%. After the etch stop layer 502 has been inserted, another 0.6 μm of $Al_xGa_{1-x}As$ layer 137 is deposited. Afterwards, approximately 100 nm of n-type GaAs layer 138 is formed on the $Al_xGa_{1-x}As$ layer 137. The etch stop layer 502 is put in so that the structure can be etched down to part of the $Al_xGa_{1-x}As$ cladding layer 136.

To form the mesa structure 500, silicon nitride 510 is deposited over the entire sample. Then, using a mask, the silicon nitride is removed from the areas where a mesa structure is not desired, thereby exposing portions of the n-type GaAs layer. The exposed areas are then removed by etching down to the etch stop layer 502, forming mesa 500. After etching, approximately 0.6 μμm of a p-type GaAs layer 139 is deposited. This p-type layer planarizes the surface and directs current flow through the n-type mesa. Lateral waveguiding for the upper lasing element 144 is achieved because the effective refractive index in the region under the mesa structure 500 is higher than the refractive index in regions under the p-type GaAs layer 139. Regions under the p-type GaAs 139 have a lower refractive index because the thickness of the n-type $Al_xGa_{1-x}As$ layer 136 in that region is less than 0.4 μm, causing the propagation mode of the laser to interact with the lossy p-type GaAs 139.

Figure 6:
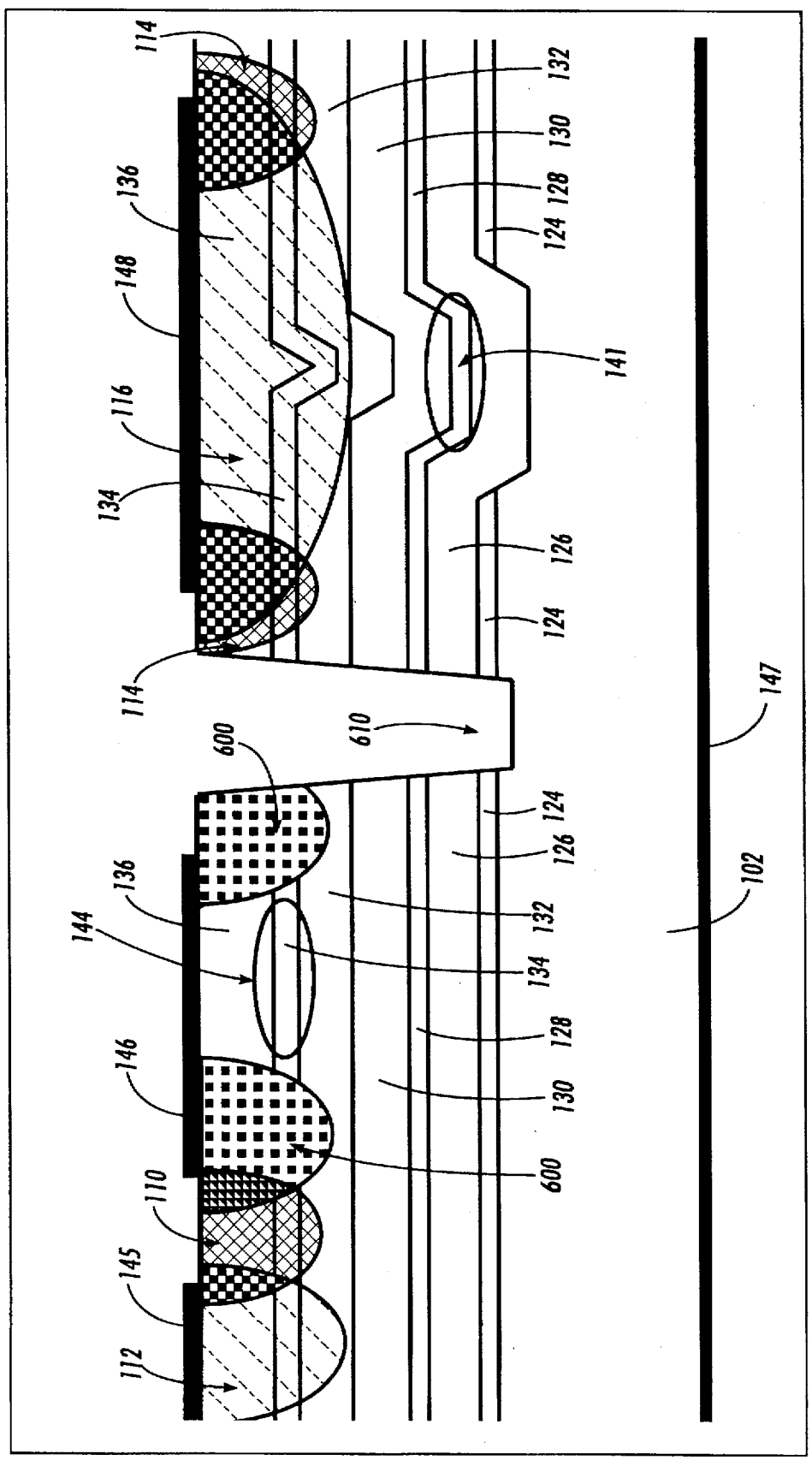
FIG. 6 shows a dual laser array in which the lateral waveguiding structure for the lasing element closest to the surface is formed by using impurity induced layer disordering.

FIG. 6 illustrates another approach in forming a lateral waveguide in the upper laser structure using impurity or vacancy induced layer disordering ("IILD"). Under this approach, p-type disordering atoms or gallium vacancies are diffused into shaded regions 600 of the top n-type $Al_xGa_{1-x}As$ layer 136, penetrating through the active GaAs layer 134 and the p-type $Al_xGa_{1-x}As$ layer 132, forming the lateral waveguide for the upper lasing element 144. It is well-known that IILD can be used to form lateral waveguides in $GaAs/Al_xGa_{1-x}As$ materials as shown in U.S. Pat. No. 5,386,428, entitled "Stacked Active Region Laser Array For Multicolor Emission," by Thornton et al. It is also well-known that zinc or silicon diffused under gallium rich conditions can be used to produce p-type disordering. A discussion of such a process can be found in U.S. Pat. No. 5,376,583, entitled "Method for Producing P-Type Impurity Induced Layer Disordering" by Northrup et al. For the structure shown in FIG. 6, after the layer disordering is completed, the mask above laser element 144 is removed, and the entire surface is diffused with an n-type dopant such as silicon to reconvert the p-type diffused cap layer and part of the AlGaAs cladding layer 136 to n-type material for efficient electron injection into the active layer 134 of the upper lasing element 144.

In the event that n-type IILD is used to form the lateral waveguides of the upper lasing element 144, a p-type or an undoped $Al_xGa_{1-x}As$ layer can also be used in this invention, rather than the n-type $Al_xGa_{1-x}As$ cladding layer 136 as shown in FIG. 6. If p-$Al_xGa_{1-x}As$ or undoped $Al_xGa_{1-x}As$ is used, electrons will be laterally injected into the active layer 134 from the regions which have been disordered by silicon atoms 600. This disordering process is taught in U.S. Pat. No. 5,038,185, entitled "Structurally Consistent Surface Skimming Hetero-Transverse Junction Lasers and Lateral Heterojunction Bipolar Transistors", by Thornton et al. The electrons will then recombine with holes in the active layer 134 to produce light. In this embodiment, the use of an undoped $Al_xGa_{1-x}As$ layer 136 is preferred because no parasitic junction will be formed between the IILD regions and the undoped $Al_xGa_{1-x}As$ layer 132 where electrons can be lost through radiative or non-radiative recombination.

Regardless of whether a mesa structure or an IILD process is used to form the lateral waveguides of the upper lasing element, an n-type contact 146 to the upper lasing element 144 is formed as shown in FIGS. 1 or 6. The p-type contact for the upper lasing element 144 is formed by zinc diffusion into the buried p-layer 132 in region 112 as shown in FIGS. 1 and 6. To electrically isolate the region 112 under the p-type contact 145 and the disordered region 600 under the n-type contact 146, proton bombardment is used in the region 110 between the p-type contact and the n-type contact.

FIG. 6 also illustrates the formation of contacts to the lower lasing element 141. Since the upper lasing element is not removed under the present invention, the layers constituting the upper lasing element 144 should be short-circuited so that carriers will flow directly to the lower lasing element 141. One approach is to diffuse zinc into the region 116 above the active region of the lower lasing element 141. The depth of the zinc diffusion generally extends beyond the GaAs active layer 134. In fact, the zinc diffusion preferably penetrates into the cladding layer 132 but can be as deep as the p-type $Al_xIn_{1-x}P$ layer 130. A p-type contact 148 is then be placed on top of the zinc diffused area 116 so that the current is injected only into the lower lasing element 141. The n-type contact 147 to the lower laser element 141 is generally made through the substrate side of the sample.

After the lasing elements have been formed, regions must be formed to isolate the contacts and the individual lasing elements. FIG. 6 illustrates the use of proton implantation to form the cross-hatched regions 110 and 114, which isolate the contacts. In this embodiment, a groove 610 is used to laterally isolate the upper and lower lasing elements. Other isolation techniques known to those of ordinary skill in the art may also be used.

The composition, dopants, doping levels and dimensions given above are exemplary only and variations in these parameters are permissible. Additionally, other layers in addition to the ones shown in the Figures may also be included. Lastly, instead of GaAs and GaAlAs, other light emitting semiconductor materials, such as GaAlSb, InP, InGaAsP, other III–V alloys, II–VI alloys, and IV–VI alloys, may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. An independently-addressable semiconductor laser array, comprising:
   a substrate having a surface structure;
   a plurality of semiconductor layers forming a first lasing element in a first optical cavity and a second lasing element in a second optical cavity, wherein said first and second optical cavities are spatially separated;
   an as-grown lateral waveguiding region for said first lasing element formed by said structure, providing confinement of the optical field in said first lasing element in the lateral direction;
   an isolation region formed between said first and second lasing elements to electrically isolate said first and second lasing elements; and
   an electrode connected to each of said first and second lasing elements causing each of said lasing elements to independently emit radiation.

2. The independently-addressable semiconductor laser array of claim 1 wherein said structure is a depression in the substrate.

3. The independently-addressable semiconductor laser array of claim 2 wherein said depression is a channel.

4. The independently-addressable semiconductor laser array of claim 2 wherein said depression is an elongated groove.

5. The independently-addressable semiconductor laser array of claim 1 wherein said structure is a protrusion on said substrate.

6. The independently-addressable semiconductor laser array of claim 5 wherein said protrusion is a mesa.

7. The independently-addressable semiconductor laser array of claim 1 wherein said first lasing element emits radiation at a first wavelength and said second lasing element emits radiation at a second wavelength.

8. The independently-addressable semiconductor laser array of claim 1 wherein said first lasing element emits radiation at a first polarization and said second element emits radiation at a second polarization orthogonal to said first polarization.

9. The independently-addressable semiconductor laser array of claim 1 wherein said first lasing element is closer to said substrate than said second lasing element.

10. The independently-addressable semiconductor laser array of claim 1 wherein a lateral waveguiding region of said second lasing element is formed by a mesa structure.

11. The independently-addressable semiconductor laser array of claim 1 wherein a lateral waveguiding region of said second lasing element is formed by a channel structure.

12. The independently-addressable semiconductor laser array of claim 1 wherein a lateral waveguiding region of said second lasing element is formed by layer disordering.

13. The independently-addressable semiconductor laser array of claim 1 wherein said first lasing element is made of a first semiconductor material system and said second lasing element is made of a second semiconductor material system.

14. The independently-addressable semiconductor laser array of claim 13 wherein said first semiconductor material system is made of phosphides and said second semiconductor material system is made of arsenides.

15. The independently-addressable semiconductor laser array of claim 1 wherein said substrate is GaAs.

16. The independently-addressable semiconductor laser array of claim 1 wherein a layer of a conductivity type opposite to that of said substrate is located above areas outside of said structure.

17. The independently-addressable semiconductor laser array of claim 16 wherein said conductivity type is p-type.

18. The independently-addressable semiconductor laser array of claim 1 wherein said isolation region is a groove.

19. The independently-addressable semiconductor laser array of claim 1 wherein said isolation region is formed by proton implantation.

20. The independently-addressable semiconductor laser array of claim 1 wherein said array is an element of an electronic device.

21. The independently-addressable semiconductor laser array of claim 20 wherein said electronic device is a raster output scanning device.

22. The independently-addressable semiconductor laser array of claim 1 wherein said array is an element of a system comprising a plurality of electronic devices.

23. The independently-addressable semiconductor laser array of claim 22 wherein said plurality of electronic devices is networked.

* * * * *